(12) United States Patent
Rattner et al.

(10) Patent No.: US 6,849,554 B2
(45) Date of Patent: Feb. 1, 2005

(54) METHOD OF ETCHING A DEEP TRENCH HAVING A TAPERED PROFILE IN SILICON

(75) Inventors: Michael Rattner, Santa Clara, CA (US); Jeffrey D. Chinn, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/137,176

(22) Filed: May 1, 2002

(65) Prior Publication Data

US 2003/0207579 A1 Nov. 6, 2003

(51) Int. Cl.[7] .............................................. H01L 21/302
(52) U.S. Cl. ..................... 438/706; 438/701; 438/713; 216/67
(58) Field of Search ................................ 438/700, 706, 438/710, 712, 713, 720, 701; 216/58, 67, 72

(56) References Cited

U.S. PATENT DOCUMENTS

| | | | |
|---|---|---|---|
| 4,522,681 A | * 6/1985 | Gorowitz et al. | ........... 438/713 |
| 4,784,720 A | 11/1988 | Douglas | |
| 4,790,903 A | 12/1988 | Sugano et al. | |
| 5,176,790 A | 1/1993 | Arleo et al. | |
| 5,302,241 A | 4/1994 | Cathey, Jr. | |
| 5,498,312 A | 3/1996 | Laermer et al. | |
| 5,501,893 A | 3/1996 | Laermer et al. | |
| 5,562,801 A | * 10/1996 | Nulty | .......................... 438/695 |
| 5,877,032 A | * 3/1999 | Guinn et al. | ................... 438/9 |
| 6,187,685 B1 | * 2/2001 | Hopkins et al. | .............. 216/37 |
| 6,277,756 B1 | * 8/2001 | Ohara et al. | ................ 438/700 |
| 6,284,148 B1 | * 9/2001 | Laermer et al. | .............. 216/37 |

FOREIGN PATENT DOCUMENTS

EP         0 822 582 A2      2/1998

OTHER PUBLICATIONS

Henri Jansen et al., "The black silicon method: a universal method for determining the parameter setting of a flourine--based reactive ion etcher in deep silicon trench etching with profile control," J. Micromech. Microeng. (1995). pp. 115–120, vol. 5, United Kingdom.

* cited by examiner

Primary Examiner—Lan Vinh
(74) Attorney, Agent, or Firm—Shirley L. Church

(57) ABSTRACT

Disclosed herein is a method of etching deep trenches in a substrate which utilizes the overlying mask structure to achieve a trench having a positive tapered sidewall angle of less than about 88°. The method employs the successive etching of a lateral undercut in the substrate beneath a masking material, while at the same time etching vertically downward beneath the mask. The coordinated widening of the lateral undercut at the top of the trench, while vertically extending the depth of the trench, is designed to provide the desired trench sidewall taper angle.

34 Claims, 6 Drawing Sheets

METHOD OF ETCHING A DEEP TRENCH HAVING A TAPERED PROFILE IN SILICON

BACKGROUND OF THE INVENTION

1. Field of the Invention

The present invention pertains to a method of etching a deep trench with a sidewall having a positive taper angle of less than about 88° in a silicon substrate.

2. Brief Description of the Background Art

Deep trench silicon etching is one of the principal technologies currently being used to fabricate microstructure devices, and is an enabling technology for many microelectromechanical systems (MEMS) applications. Strict control of the silicon etch profile is required for these new, complex devices to perform satisfactorily. Of particular interest are deep trenches with a sidewall having a positive taper angle of less than about 85°. Obtaining a controlled sidewall taper angle of less than about 88°, and particularly less than about 85°, has proved a difficult task in many instances.

Trenches with a sidewall positive taper angle of less than about 85° are useful in fields as diverse as microfluidics, optics, and micromolding. Microfluidics applications often require nozzles made out of silicon. A positive taper, through-wafer etch is used to provide the proper shape for controlling the flow of gases or fluids. Another use of tapered trenches is in micron-scale, hexagonal pipes that have been fabricated using trench etching techniques.

Tapered trenches having the proper sidewall angle can be used as fiber alignment devices in micro-electro-opto-mechanical systems (MOEMS). "V-grooves" are etched in a silicon wafer, then used as guides for fibers, allowing easy alignment of the fibers with optical devices such as waveguides, filters, and switches. In another application, a two-dimensional array of fibers can be aligned with an array of mirrors by using an array of wafer through-holes. A double-polished wafer has one side coated with a CVD oxide. Using a special resist and etch process, the oxide can be patterned to form an array of microlenses. A hole pattern is then aligned to the backside of the wafer. Through-holes are etched in the wafer to bring the fiber to the lens. Fibers then must be inserted into the array by hand, which is a time-consuming and difficult process, especially for large arrays. If a proper tapering of the profile of the through-holes could be obtained, fiber placement could be made much easier, as the fiber is aligned by the taper.

Micromolding techniques are useful in many areas, but are most frequently used in MEMS for biomedical applications ("bioMEMS"). According to one technique, the etched silicon wafer is used as a mold to create devices out of a malleable material, such as plastic or a metal. A mold sidewall having a positive taper, which provides a larger dimension at the location from which the molded part must exit, permits separation of the molded part from the mold more easily. In this process, a smooth sidewall is also critically important, as sidewall roughness can lead to extraction difficulties or process failure.

Deep trench etching of silicon is traditionally accomplished using one of two methods. The first of these methods is wet KOH etching, which has many limitations. One significant limitation of wet KOH etching is that the etch taper is fixed by the crystalline lattice structure of the substrate which, in the case of single-crystal silicon, produces a taper angle of 54.7°, because the etch occurs along the crystal planes. This lack of profile variability means that devices have to be designed to wet KOH etch limitations. KOH etching is typically limited to silicon wafers having a [111] crystal orientation, when fabricating tapered trenches. This can cause compatibility problems with processing steps that may work only on [100] oriented silicon wafers. Another issue with KOH etching is that it requires the use of a hard mask, such as an oxide or nitride mask, which increases the fabrication costs. Further, in terms of process integration, since wet etching cannot be performed in a vacuum, and most semiconductor processing chambers are designed to operate under vacuum, wet etches are generally avoided in semiconductor production lines. If MEMS are to become mainstream production products, process integration of MEMS may also dictate the avoidance of wet etch processes. The use of wet etch processes, such as KOH etching, is also limited to situations where the creation of residue particles and process chamber contamination issues are not as important, such as in a research environment.

In contrast to wet etching, dry etching has many advantages in production processes. For example, dry etching allows for better stoichiometric control of the etch environment because the continuous gas flow through the process chamber maintains the concentration of etchant gases and species in the chamber relatively constant over time. Further, dry etching processes are typically performed in a vacuum, which provides constant particulate removal, leading to decreased particulate contamination of a substrate such as a substrate wafer.

Currently, one of the commonly used silicon deep trench etch processes is based upon a cyclic etch/polymer deposition process. The cyclic etch/polymer deposition processes cycle between silicon etch and passivation/deposition steps, with each cycle removing as much as one micron (1 μm) of material, for example. The etch/deposition cycle process allows for the use of highly aggressive, but less directional, etchants, such as $SF_6$, while still providing a degree of control over the etch profile, such as a trench sidewall profile. Polymer-forming gases, such as $CHF_3$, $CH_2F_2$, $C_2F_6$, and $C_4F_8$, may be used during the polymer deposition step, to coat the trench sidewalls and assist in etch profile control. Typical process conditions for performing a presently known etch/deposition method are as follows: The plasma source gas is fed into a process chamber containing the substrate to be etched, with the flow rate of the gas being dependent on the process chamber design. During the etch step, the plasma source power applied provides a plasma density of about $8 \times 10^9$ $e^-/cm^3$ to about $3 \times 10^{11}$ $e^-/cm^3$ at a process pressure between about 5 mTorr and 200 mTorr. To obtain anisotropic etching, the substrate is typically biased at about 40 W or less (more typically, at about 15 W) with no bias being applied during the deposition step. Generally, the substrate temperature during both etching and passivant deposition is in the range of about 40° C. to about 110° C.

Etch/deposition processes tend to lengthen the photoresist lifetime, allowing for the etching of deeper trenches using only a photoresist mask. In addition, etch/deposition processes may be applied to silicon wafers having any crystalline orientation. The etch rates achieved using the etch/deposition process may be as high as 10 microns per minute or more, which is significantly faster than etch rates obtained using KOH etching. Etch/deposition processes typically provide good etch uniformity across a 200-mm diameter wafer. When a hard mask is used in lieu of photoresist, the selectivity for etching the silicon relative to the masking material is even greater than when photoresist is used.

While the etch/deposition cycle process described above has many advantages over wet etching, the etching of trenches having a sidewall taper angle of less than about 88° using presently known etch/deposition processes has not been successful. The presently known etch/deposition process utilizes a high substrate bias power during the etching step to obtain an acceptable etch rate. The high bias power produces a highly anisotropic etch. To achieve a trench sidewall taper angle of less than about 88°, a high polymer deposition rate is required. This can be accomplished by either increasing the flow rate of the deposition polymer or increasing the deposition time. If both these criteria are met, then each successive etch/deposition cycle will cause a smaller trench width than the previous step. This is due to a reduction of the effective mask critical dimension which is caused by polymer overdeposition in each cycle, as illustrated in FIGS. 1A–1E. FIG. 1A shows a typical starting structure 100 for performing a presently known etch/deposition process. Structure 100 comprises a patterned photoresist layer 104 overlying a bare silicon wafer 102. FIG. 1B shows structure 100 after performance of a relatively anisotropic $SF_6$ etch for initial trench 106 formation. FIG. 1C shows structure 100 after the performance of a first polymer deposition step. A thick layer 108 of polymer has been deposited on the bottom and sidewalls of trench 106. FIG. 1D shows the structure 100 after the start of the second $SF_6$ etch cycle. The bottom 110 of trench 106 has been cleared of polymer. The etch rate of the polymer at the bottom of the trench relative to the polymer on the sidewalls of the trench is high due to the applied substrate bias, which causes the $SF_6$ etch to be anisotropic. FIG. 1E shows structure 100 after the completion of the second $SF_6$ etch step. The width $w_2$ of the lower trench 112 is smaller than the width $w_1$ of the upper trench 106, due to the smaller effective mask size which results from the continued presence of polymer 108 on the sidewalls of upper trench 106.

Using high bias etching and increased polymer deposition has proven effective in etching trenches with sidewall positive taper angles ranging from about 90° down to about 88°. However, a sidewall angle of 88° is too steep for many of the MEMS and MOEMS applications described above. This taper angle limitation occurs because of the process effects described above, which induce the formation of sidewalls having steep angles. For example, in order to produce adequate sidewall protection as the etch progresses, the deposition of polymer at the bottom of the trench may become so great that the polymer is not completely cleared in the subsequent etch step. These small islands of polymer act as a micromask for the next etch step. After a series of etch/deposition cycles, silicon structures, frequently referred to as "grass", and having the appearance of stalagmites are formed. FIGS. 2A and 2B show the formation of silicon grass 202, 204, at a trench entry and at the bottom of a trench, respectively. The formation of silicon grass can halt an etch process.

SUMMARY OF THE INVENTION

We have developed a method of etching trenches having a depth of at least 20 µm in a substrate which utilizes the overlying mask structure to achieve a trench having a positive tapered sidewall angle of less than about 88°, and often less than about 85°. The method employs the successive etching of a lateral undercut in the silicon beneath a masking material, while at the same time etching vertically downward beneath the mask. The coordinated widening of the lateral undercut at the top of the trench, while vertically extending the depth of the trench, is designed to provide the desired trench sidewall taper angle. The substrate is typically silicon, but may alternatively be a metal or an oxide. Etching is typically accomplished using a plasma generated from a plasma source gas comprising fluorine species, or chlorine species, or a combination of fluorine species and chlorine species.

Coordinated etching of trenches in a substrate is accomplished using a low substrate bias power of less than about 35 W; more typically, less than about 15 W. This typically correlates to a substrate bias voltage of between about –2 V and about –100 V; more typically, about –10 V to about –100 V. Etching is performed at a process chamber pressure which is typically in excess of about 60 mTorr. When the substrate is silicon, the etch plasma is designed to provide a silicon etch rate in excess of about 2 microns per minute; more typically, between about 7 and about 10 microns per minute.

The low substrate bias results in more isotropic etching, thereby permitting significant undercutting beneath the masking layer (which may be a photoresist, a hard mask, or a combination of a photoresist with an underlying hard mask). A high process chamber pressure during both the etch and polymer deposition steps is very important in achieving taper angles of less than 88°. An increase in process chamber pressure provides a significant increase in the etch rate, while increasing the isotropicity of the etch. The rapid etch rate described above, in combination with a slow polymer deposition rate, generally ensure that all of the deposited polymer will be etched away by the end of an individual etch cycle. A substrate bias is used to adjust the relative anisotropicity (or isotropicity) of the etch, another variable which, in combination with the variables discussed above, helps achieve the desired trench sidewall taper angle.

The present method of etching deep trenches in silicon provides a tapered etch profile of 88° or less, and particularly 85° or less. The method comprises the following: an etching step which includes exposing a silicon substrate, through a patterned masking layer, to a plasma generated from a fluorine-containing gas, where the plasma density ranges from about $8 \times 10^9$ $e^-/cm^3$ to about $3 \times 10^{11}$ $e^-/cm^3$, and where the substrate is biased from about –2 V to about –100 V; a polymer deposition step which includes exposing the silicon substrate to a plasma generated from a gas which is capable of forming a polymer on an etched silicon surface; and, repeating the etch/deposition process a plurality of times during formation of the trench. In one embodiment, the etching step and the polymer deposition step are carried out simultaneously. The etching step and the polymer deposition step are performed at a process chamber pressure within the range of about 30 mTorr to about 180 mTorr. The process chamber pressure may be adjusted between the etch step and the deposition step. A bias power within the range of 0 to about 35 W is applied to the substrate during the etching step, to produce substrate voltages in the range described above. Both etching and deposition steps are performed at a substrate temperature ranging from about 20° C. to about 120° C.

The method may further include a clean-up step, which is performed following at least one of the silicon etching steps to remove deposited polymer from the bottom of the etched trench. The clean-up step is performed by exposing the silicon substrate to an oxygen plasma. A bias power within the range of less than about 100 W is typically applied to the substrate during the oxygen plasma clean-up step. The substrate temperature is typically within a range of about 40° C. to about 120° C. during the clean-up step.

The method of the invention provides an average silicon etch rate of about 7 to about 10 microns per minute when the etch and deposition processes are both included. The trench sidewall profile angle may be controlled to range between about 40° and about 85°. The method of the invention is particularly applicable to the etching of trenches having a depth of at least 20 microns, with a trench sidewall angle ranging from about 60° to about 85°.

BRIEF DESCRIPTION OF THE DRAWINGS

FIGS. 1A–1E illustrate the reduction of the effective mask critical dimension because of polymer overdeposition in each step of a previously known etch/deposition process.

FIG. 1A shows a typical starting structure 100 for performing a previously known etch/deposition process. Structure 100 comprises a patterned photoresist layer 104 overlying a bare silicon wafer 102.

FIG. 1B shows structure 100 after performance of a relatively anisotropic $SF_6$ etch for initial trench 106 formation.

FIG. 1C shows structure 100 after the performance of a first polymer deposition step. A thick layer 108 of polymer has been deposited on the bottom and sidewalls of trench 106.

FIG. 1D shows structure 100 after the start of the second $SF_6$ etch cycle. The bottom 110 of trench 106 has been cleared of polymer.

FIG. 1E shows structure 100 after the completion of the second $SF_6$ etch step. The width $w_2$ of the lower trench 112 is smaller than the width $w_1$ of the upper trench 106 due to the smaller effective mask size which results from the continued presence of polymer 108 on the sidewalls of trench 106.

FIG. 3A shows a typical starting structure 300 for performing the silicon etching method of the invention. Structure 300 comprises a patterned masking layer 304 overlying a bare silicon wafer 302.

FIG. 3B shows structure 300 after performance of the first silicon etching step of the invention. An undercut trench 306 has been formed in the silicon substrate 302.

FIG. 3C shows structure 300 after the performance of the first polymer deposition step of the invention. A moderately thin layer 308 of polymer has been deposited on the bottom and sidewalls of trench 306.

FIG. 3D shows structure 300 after the start of the second silicon etching step of the invention. During the first part of the second etch step, only the bottom 310 of the trench 306 has been cleared of polymer due to the mild applied substrate bias.

FIG. 3E shows structure 300 after performance of the second silicon etching step of the invention. Due to the high process chamber pressure, high energy ions are able to clear the polymer from the sidewalls as well as the bottom of trench 306.

FIG. 3F shows structure 300 after the performance of numerous etching and polymer deposition steps, during which a trench sidewall having a positive tapered etch profile is achieved, producing a trench sidewall angle θ.

FIG. 4A shows a trench 410 which was etched at a process chamber pressure 30 mTorr. Trench 410 had a depth $d_A$ of 25 μm, a width $w_A$ of 30 μm, and an etch profile angle $\theta_A$ of 82°.

FIG. 4B shows a trench 420 which was etched at a process chamber pressure of 120 mTorr. Trench 420 had a depth $d_B$ of 45 μm, a width $w_B$ of 35 μm, and an etch profile angle $\theta_B$ of 74°.

FIG. 4C shows a trench 430 which was etched at a process chamber pressure of 150 mTorr. Trench 430 had a depth $d_C$ of 50 μm, a width $w_C$ of 35 μm, and an etch profile angle $\theta_C$ of 60°.

FIG. 4D shows a trench 440 which was etched at a process chamber pressure of 150 mTorr. Trench 440 had a depth $d_D$ of 55 μm, a width $w_D$ of 35 μm, and an etch profile angle $\theta_D$ of 60°.

DETAILED DESCRIPTION OF EXEMPLARY EMBODIMENTS

Disclosed herein is a method of etching deep trenches in silicon which provides a tapered sidewall etch profile, where the taper angle is less than 88°, and commonly less than 85°. Exemplary processing conditions for performing various embodiments of the method of the invention are set forth below.

As a preface to the detailed description, it should be noted that, as used in this specification and the appended claims, the singular forms "a", "an", and "the" include plural referents, unless the context clearly dictates otherwise.

I. AN APPARATUS FOR PRACTICING THE INVENTION

The embodiment example etch processes described herein were carried out in a CENTURA® Integrated Processing System available from Applied Materials, Inc., of Santa Clara, Calif. This apparatus is described in detail below; however, it is contemplated that other apparatus known in the industry may be used to carry out the invention.

Figure 5A:
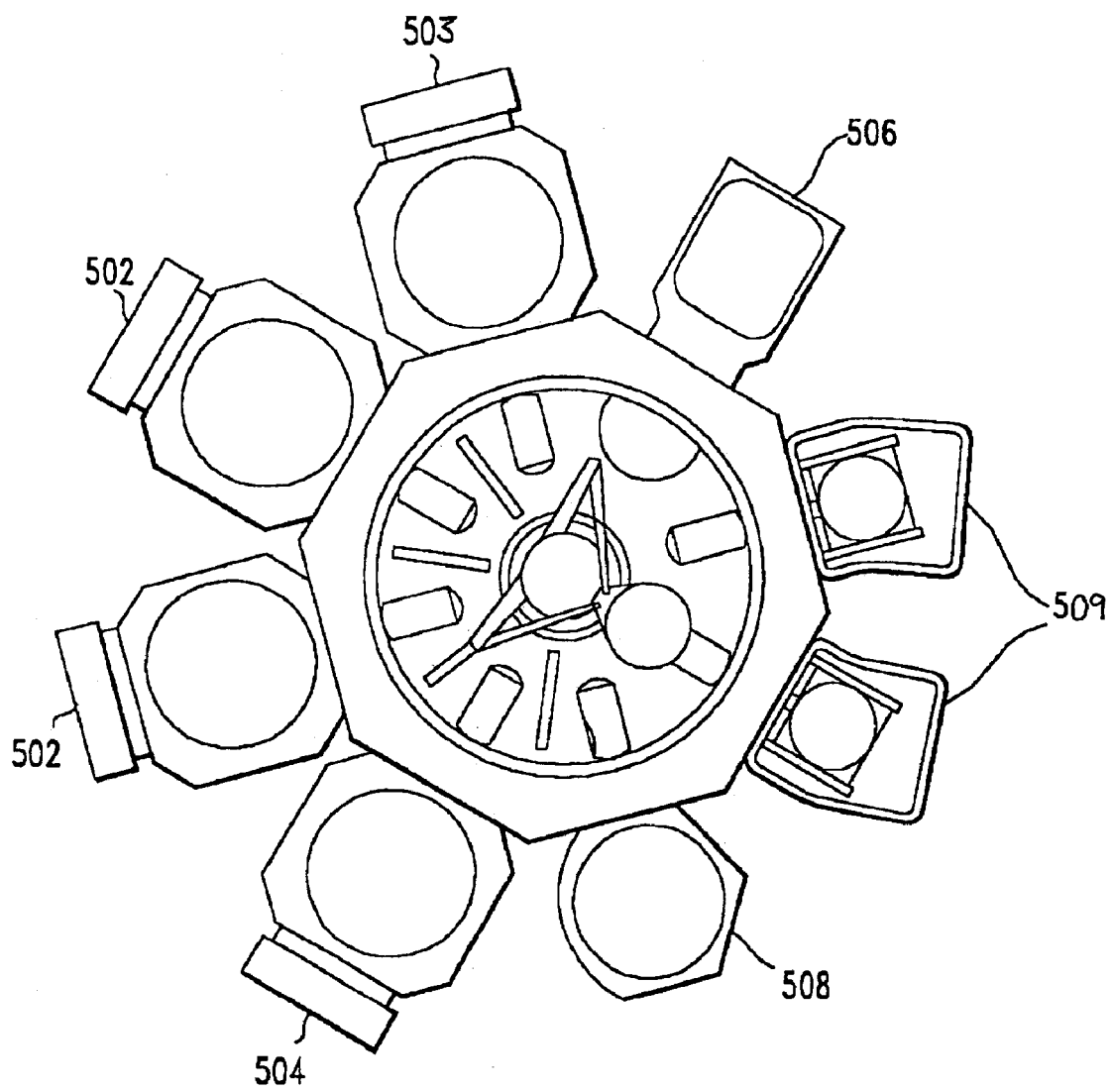
FIG. 5A shows a schematic of a multi-chambered semiconductor processing system of the kind which can be used to carry out the processes described herein.

FIG. 5A shows an elevation schematic of the CENTURA® Integrated Processing System. The CENTURA® Integrated Processing System is a fully automated semiconductor fabrication system, employing a single-wafer, multi-chamber, modular design which accommodates 200-mm or 300-mm wafers. For example, as shown in FIG. 5A, the CENTURA® etch system may include decoupled plasma source (DPS) etch chambers 502; deposition chamber 503; advanced strip-and-passivation (ASP) chamber 504; wafer orienter chamber 506; cooldown chamber 508; and independently operated loadlock chambers 509.

Figure 5B:
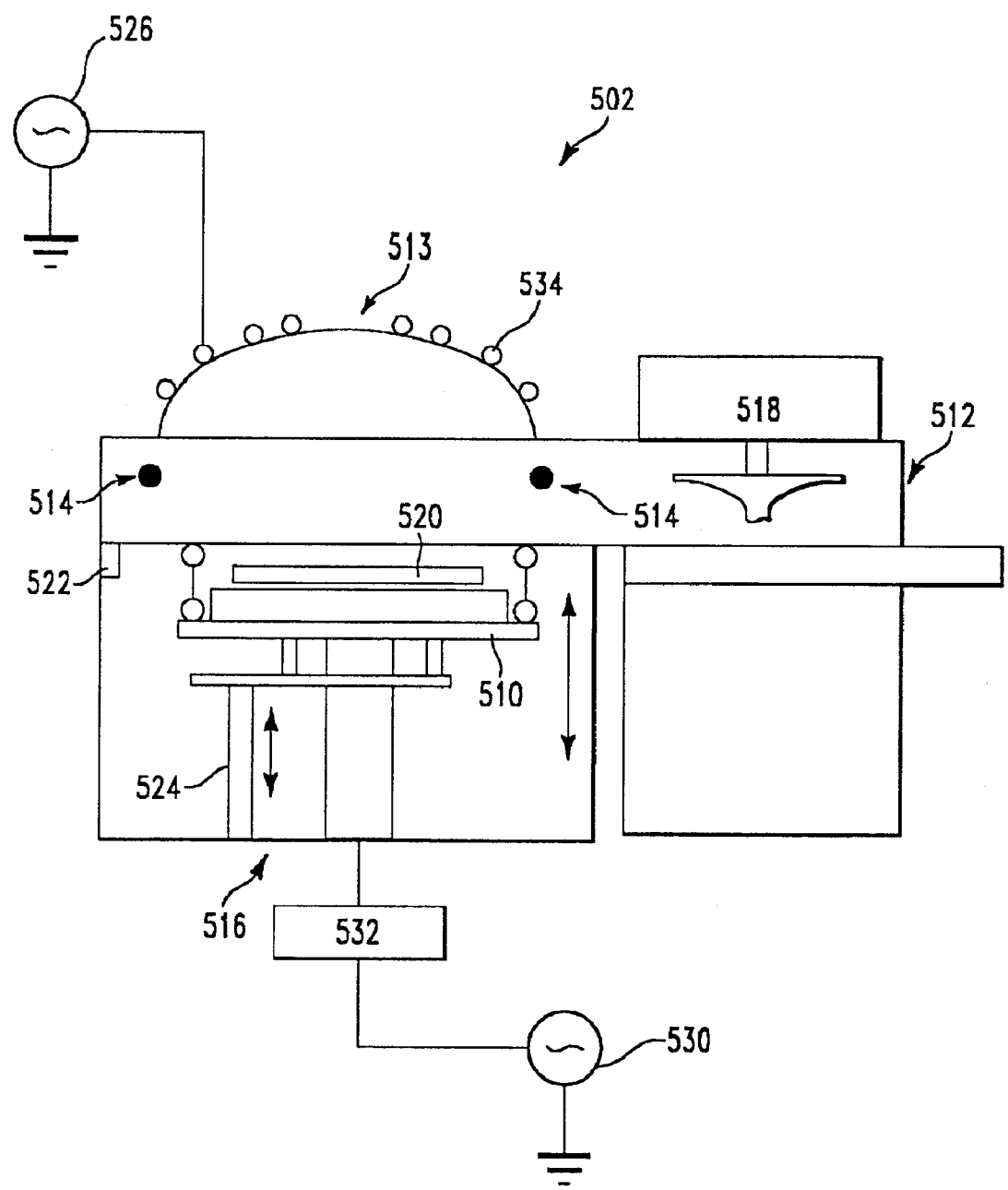
FIG. 5B shows a schematic of a cross-sectional view of a plasma etch chamber of the kind which can be used to carry out the etching processes described herein.

FIG. 5B is a schematic of an individual CENTURA® DPS™ etch chamber 502 of the type which may be used in the Applied Materials' CENTURA® Integrated Processing System. The equipment shown in schematic in FIG. 5B includes a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96-12, pp. 222–233 (1996). The CENTURA® DPS™ etch chamber 502 is configured to be mounted on a standard CENTURA® mainframe.

The CENTURA® DPS™ etch chamber 502 consists of an upper chamber 512 having a ceramic dome 513, and a lower chamber 516. The lower chamber 516 includes an electrostatic chuck (ESC) cathode 510. Gas is introduced into the chamber via gas injection nozzles 514 for uniform gas distribution. Chamber pressure is controlled by a closed-loop pressure control system (not shown) with a throttle valve 518. During processing, a substrate 520 is introduced into the lower chamber 516 through inlet 522. The substrate 520 is held in place by means of a static charge generated on the surface of electrostatic chuck (ESC) cathode 510 by applying a DC voltage to a conductive layer located under a dielectric film on the chuck surface. The cathode 510 and substrate 520 are then raised by means of a wafer lift 524 and a seal is created against the upper chamber 512 in position for processing. Etch gases are introduced into the upper chamber 512 via the ceramic gas injection nozzles 514. The etch chamber 502 uses an inductively coupled plasma source power 526 operating at 2 MHz, which is connected to inductive coil 534 for generating and sustaining a high density plasma. The wafer is biased with an RF source 530 and matching network 532 operating within the range of 100 kHz to 13.56 MHZ; more typically, within the range of 100 kHz to 2 MHZ. Power to the plasma source 526 and substrate biasing means 530 are controlled by separate controllers (not shown).

The temperature on the surface of the etch chamber walls is controlled using liquid-containing conduits (not shown) which are located in the walls of the etch chamber 502. The temperature of the semiconductor substrate is controlled using the temperature of the electrostatic chuck cathode 510 upon which the substrate 520 rests. Typically, a helium gas flow is used to facilitate heat transfer between the substrate and the pedestal.

As previously mentioned, although the etch process chamber used to process the substrates described in the Examples presented herein is shown in schematic in FIG. 5B, any of the etch processors available in the industry should be able to take advantage of the etch chemistry described herein, with some adjustment to other process parameters.

II. EXEMPLARY METHOD OF THE INVENTION FOR ETCHING a Deep Trench having a Tapered Sidewall Profile The method for etching deep trenches having a taper angle ranging from about 40° to about 85° in a substrate is described below with reference to FIGS. 3A–3F. The exemplary embodiments are with reference to a silicon substrate. However, the general concept of employing the successive etching of a lateral undercut in the substrate beneath a masking material, while at the same time etching vertically downward beneath the mask, with the coordinated widening of the lateral undercut at the top of the trench, while vertically extending the depth of the trench to achieve a desired trench sidewall taper angle is not restricted to a particular substrate. One skilled in the art will be able to adjust the etchant and deposition plasma source gases to accommodate other substrates.

Figure 1A:
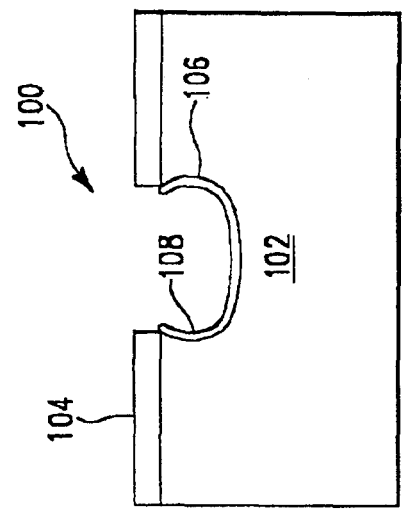
Figure 1B:
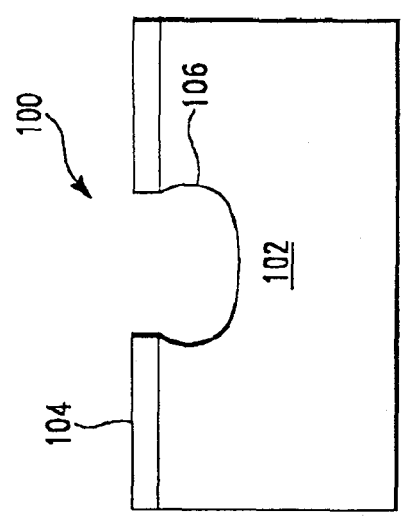
Figure 1A:
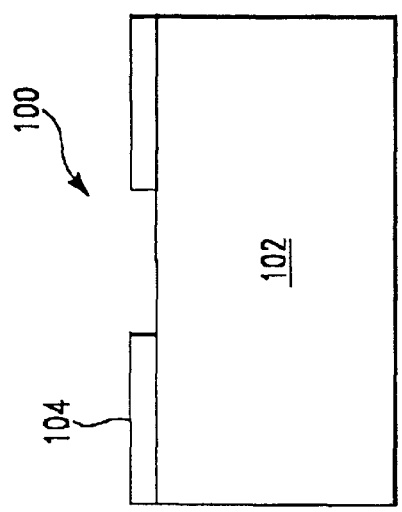
Figure 1C:
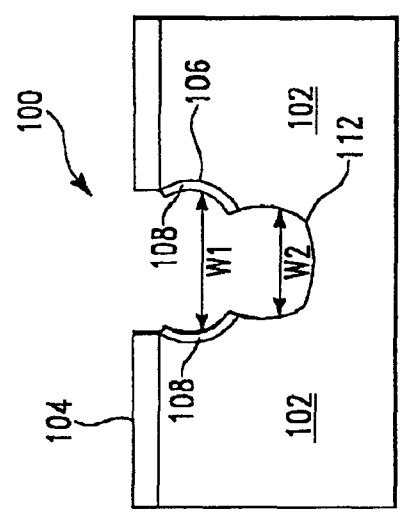
Figure 1E:
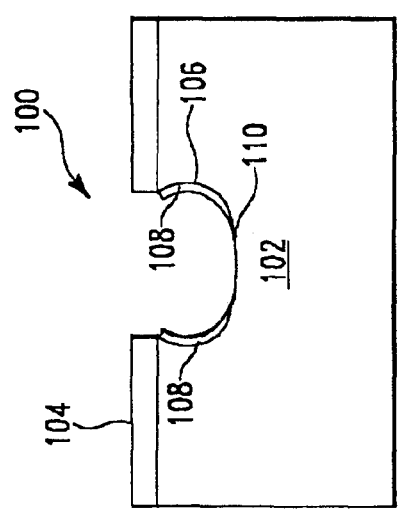
Figure 2A:
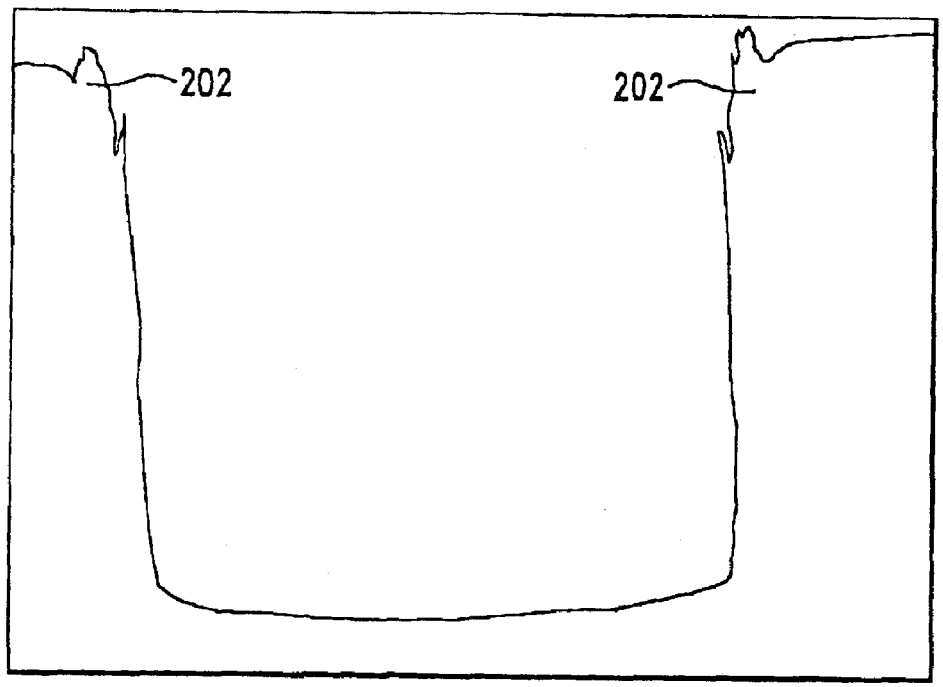
FIG. 2A shows the formation of "silicon grass" 202 at a trench entry.
Figure 2B:
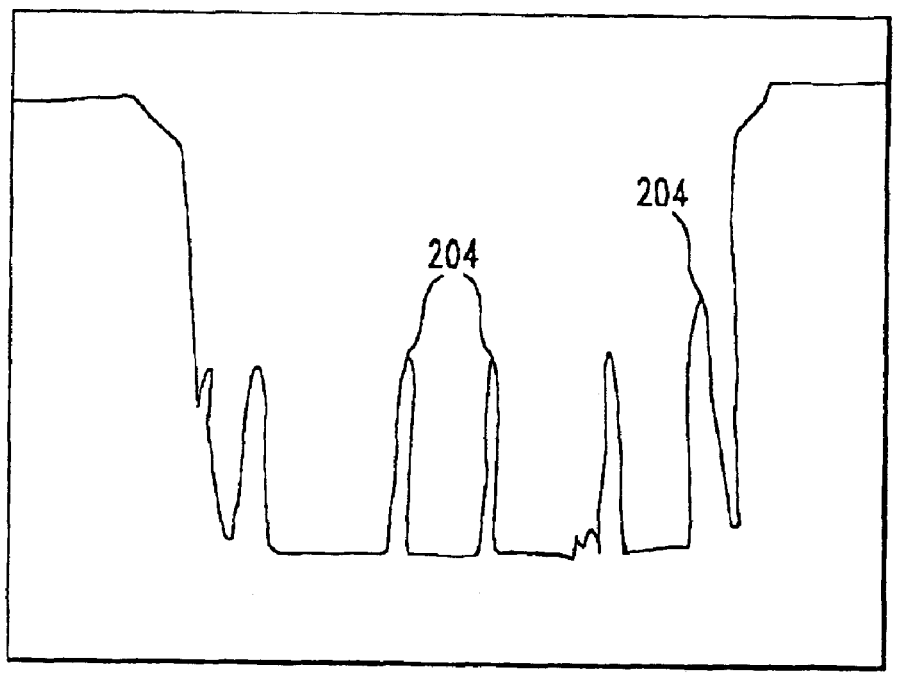
FIG. 2B shows the formation of silicon grass 204 at the bottom of a trench.
Figure 3A:
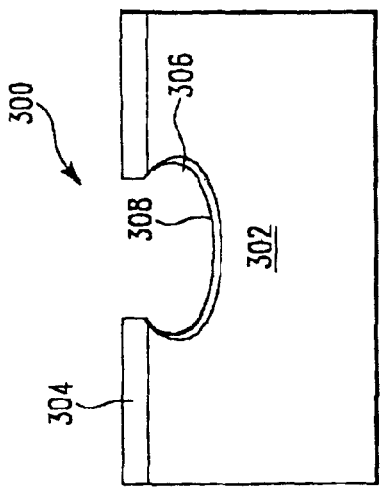
FIGS. 3A–3F illustrate a method embodiment of the invention for etching a deep trench with a sidewall having a positive taper angle in a silicon substrate.

FIG. 3A shows a typical starting structure 300 for performing the silicon etching embodiment of the method. Structure 300 comprises a patterned masking layer 304 overlying a bare silicon wafer 302. Masking layer 304 may comprise either an organic-based photoresist, a silicon-based imageable masking material, or a hard mask material, such as, for example and not by way of limitation, silicon oxide, silicon nitride, or silicon oxynitride. Deposition and patterning of the masking layer are performed using techniques known in the art, depending on the particular masking material used.

If a photoresist is used as the masking material, an organic-based photoresist thickness within the range of about 2 $\mu$m to about 4 $\mu$m is typically required for etching a 50–70 $\mu$m deep trench. If a hard mask is used, a hard mask material thickness within the range of about 0.5 $\mu$m to about 2 $\mu$m is typically required for etching a 50–70 $\mu$m deep trench. A masking layer 304 may be a dual layer comprising a layer of photoresist overlying a layer of a hard mask material.

Figure 3B:
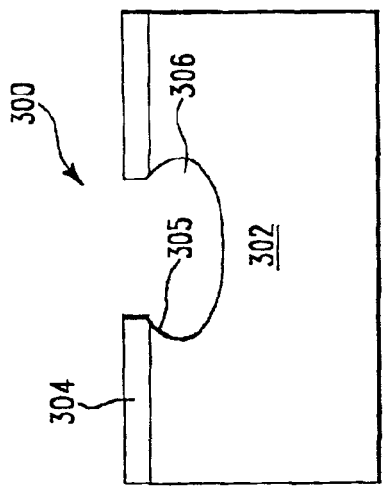

In one embodiment of the method, the silicon substrate 302 is etched by exposing the substrate 302 to a plasma generated from a fluorine-containing gas. FIG. 3B shows structure 300 after performance of the first etching step. An undercut 305 trench 306 has been formed in the silicon substrate 302.

The fluorine-containing gas is typically selected from the group consisting of $SF_6$, $CF_4$, $NF_3$, and combinations thereof. Sulfur hexafluoride ($SF_6$) has been shown to provide particularly good results. The plasma source gas may optionally include a diluent gas, such as, for example and not by way of limitation, argon, nitrogen ($N_2$), helium, xenon, krypton, and combinations thereof. The diluent gas may be used to sputter deposited polymer off the bottom of trench 306.

Typical process conditions for performing a silicon etching step of the method are provided in Table One, below:

TABLE ONE

Process Conditions for Silicon Etching Step

| Process Parameter | Range of Process Conditions | Typical Process Conditions | Optimum Known Process Conditions |
|---|---|---|---|
| $SF_6$ Flow Rate (sccm) | 50–300 | 150–250 | 200 |
| Ar Flow Rate (sccm) | 0–200 | 0–200 | 0–200 |
| Plasma Source Power (W) | 700–2000 | 900–1300 | 1000 |
| Plasma Source Power RF Frequency (kHz) | 100–13,560 | 100–2000 | 200–400 |
| Substrate Bias Power (W) | 0–35 | 5–15 | 5–10 |
| Substrate Bias Power RF Frequency (kHz) | 100–500 | 200–500 | 400 |
| Substrate Bias Voltage (- V) | 2–100 | 10–100 | 10–50 |
| Process Chamber Pressure (mTorr) | 5–200 | 25–180 | 30–150 |
| Substrate Temperature (° C.) | 20–120 | 40–100 | 60–80 |
| Etch Time Period (seconds) | 3–30 | 3–20 | 4–14 |

The principal process parameter that assists in the formation of an undercut 305 beneath the masking layer 304 is a relatively high process chamber pressure compared to prior art etch and deposition processes. The higher process chamber pressure provides two benefits that assist in an undercutting process possible. The higher pressure makes the etch step more isotropic, and leads to a more rapid etch rate due to an increased reaction rate between the chemical etchant species in the plasma and the substrate. The more isotropic etch increases the uniformity and number of ion collisions with the sidewall (as opposed to the base of the trench), allowing the trench sidewall polymer build-up (from a previous polymer deposition step when applicable) to be cleanly removed, and the etch front to propagate in a lateral direction.

In addition, a higher pressure tends to increase the rate of polymer formation and deposition, which must be controlled via other process variables, such as the composition of the plasma source gas from which the polymer is formed, and the flow rate of the polymer-forming gas. The higher pressure assists in providing an increased polymer deposition on the surface of the masking layer, lengthening the lifetime of the masking layer. Increasing the polymer deposition on the surface of the masking layer, permits the use of conventional photoresists as a mask in some instances where only a hard mask might otherwise be functional.

The process variables which work in opposition to the process variables described above, enabling tailoring of the process to provide specific results, include the substrate bias voltage. Increasing the substrate bias results in a more anisotropic etch, resulting in less undercutting beneath the mask and increased removal of the polymer deposited on the bottom of the trench relative to the sidewalls. An increase in bias voltage increases the vertical etch rate, while reducing the horizontal, lateral etch rate.

Figure 3C:
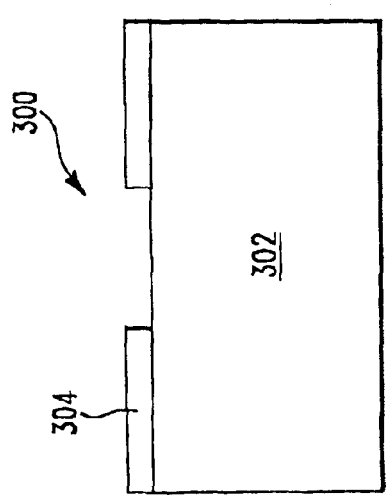

In a second step in the method embodiment, the silicon substrate 302 is exposed to a plasma generated from a gas which is capable of forming a polymer 308 on etched silicon surfaces, as shown in FIG. 3C. The polymer-forming gas is typically selected from the group consisting of $C_4F_8$, $CH_2F_2$, $CHF_3$, and combinations thereof. In order to provide optimum polymer deposition, the polymer-forming gas typically contains carbon and fluorine in a carbon:fluorine ratio of at least 1:3; more typically, in a carbon:fluorine ratio of at least 1:2. $C_4F_8$ has been shown to provide good results. The plasma source gas may optionally include a nonreactive, diluent gas, such as, for example and not by way of limitation, argon, helium, xenon, krypton, and combinations thereof.

Typical process conditions for performing the polymer deposition step of the embodiment are provided in Table Two, below:

TABLE TWO

Process Conditions for Polymer Deposition Step

| Process Parameter | Range of Process Conditions | Typical Process Conditions | Optimum Known Process Conditions |
|---|---|---|---|
| $C_4F_8$ Flow Rate (sccm) | 50–200 | 75–150 | 100 |
| Ar Flow Rate (sccm) | 0–100 | 0–100 | 0–100 |
| Plasma Source Power (W) | 700–3000 | 900–2000 | 1000 |
| Plasma Source Power RF Frequency (kHz) | 100–13,560 | 100–2000 | 200–400 |
| Substrate Bias Power (W) | 0 | 0 | 0 |
| Substrate Bias Power RF Frequency (kHz) | 100–500 | 200–500 | 400 |
| Substrate Bias Voltage (- V) | 0 | 0 | 0 |
| Process Chamber Pressure (mTorr) | 5–200 | 25–180 | 30–150 |
| Substrate Temperature (° C.) | 20–120 | 40–100 | 60–80 |
| Polymer Deposition Time Period (seconds) | 3–20 | 3–15 | 3–10 |

Figure 3D:
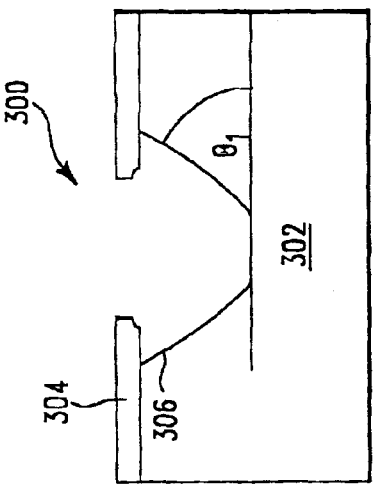

According to this embodiment of the method, a second silicon etching step is now performed. FIG. 3D shows the structure 300 after the start of the second silicon etching step. During the first part of the second etch step, the bottom 310 of the trench 306 has been cleared of polymer due to the application of a mild substrate bias, in the range of about 7 W to about 35 W.

The process conditions used during the second (or third, or fourth, etc.) silicon etching step may be the same or different from those used in the first silicon etching step, but typically fall within the process condition ranges provided in Table One, above. The plasma source power, for example, may be varied from silicon etch step to silicon etch step, or the substrate bias voltage may be varied, so that the etch profile can be even more closely controlled and defined.

Figure 3E:
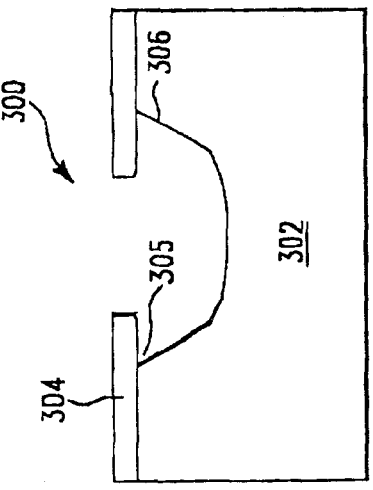

FIG. 3E shows structure 300 after performance of the second silicon etching step. Due to the high process chamber pressure, ions from the plasma are able to clear the polymer from the sidewalls as well as the bottom of trench 306. Additional undercutting 305 beneath masking layer 304 has occurred.

Figure 3F:
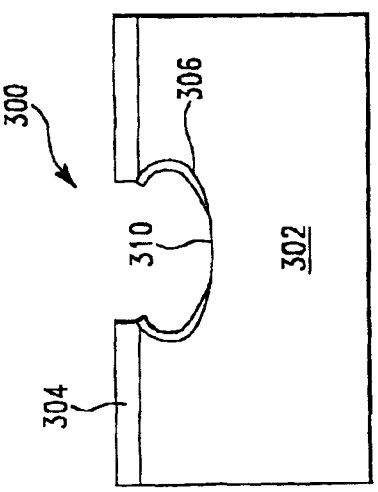

FIG. 3F shows structure 300 after the performance of numerous etching and polymer deposition steps, during which a trench sidewall having a positive tapered etch profile is achieved.

The method embodiment may further include a clean-up step, which is performed following at least one of the silicon etching steps to remove deposited polymer from the bottom of the etched trench. If desired, the clean-up step may be performed after every etching step.

The clean-up step is performed by exposing the silicon substrate to an oxygen plasma. Typical process conditions for performing the polymer deposition step of the method of the invention are provided in Table Three, below:

TABLE THREE

Process Conditions for Clean-up Step

| Process Parameter | Range of Process Conditions | Typical Process Conditions | Optimum Known Process Conditions |
|---|---|---|---|
| $O_2$ Flow Rate (sccm) | 50–500 | 100–300 | 200 |
| Plasma Source Power (W) | 500–3000 | 700–2000 | 1000 |
| Plasma Source Power RF Frequency (kHz) | 100–13,560 | 100–2000 | 200–400 |
| Substrate Bias Power (W) | 0–100 | 0–50 | 5–10 |
| Substrate Bias Power RF Frequency (kHz) | 100–500 | 200–500 | 400 |
| Substrate Bias Voltage (- V) | 0–200 | 20–150 | 40–100 |
| Process Chamber Pressure (mTorr) | 20–200 | 25–100 | 30 |
| Substrate Temperature (° C.)* | 40–120 | 50–100 | 60 |
| Clean-Up Step Time Period (seconds) | 10–600 | 100–400 | 180 |

*The substrate temperature provided is for an etch chamber having a decoupled plasma source. If a different type of etch chamber is used, the substrate temperature may be within the range of about 200° C. up to 250° C. during the oxygen plasma clean-up.

The oxygen plasma clean-up step is typically performed after completion of trench formation, or when a hard mask layer (such as silicon oxide, silicon nitride, or silicon oxynitride) is used in lieu of, or in combination with, a photoresist, due to the tendency of oxygen to rapidly etch conventional organic photoresists.

III. EXAMPLES

Figure 4A:
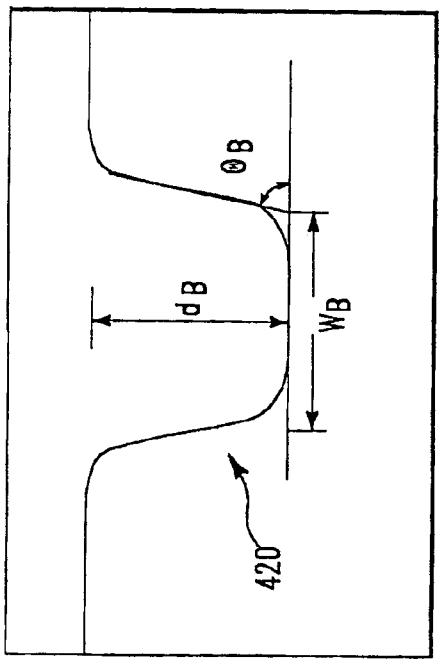
FIGS. 4A–4D show examples of undercut trenches which were etched according to the method of the invention, at various process chamber pressures.
Figure 4B:
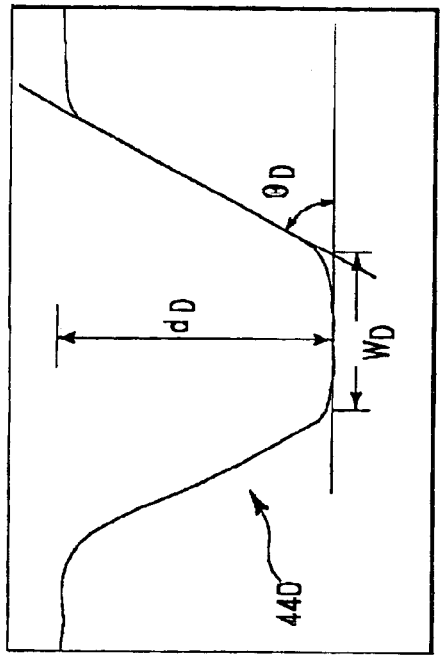
Figure 4C:
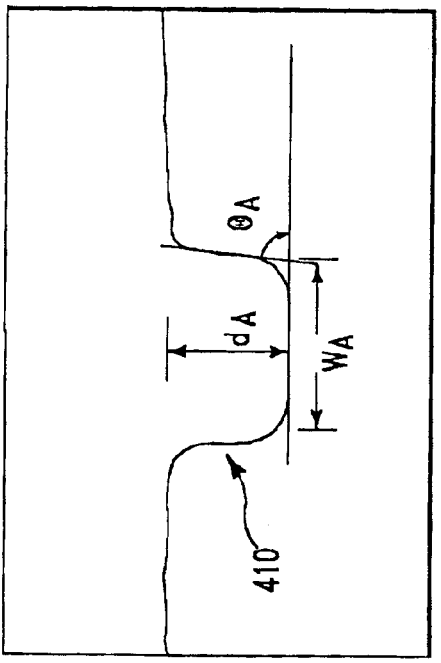
Figure 4D:
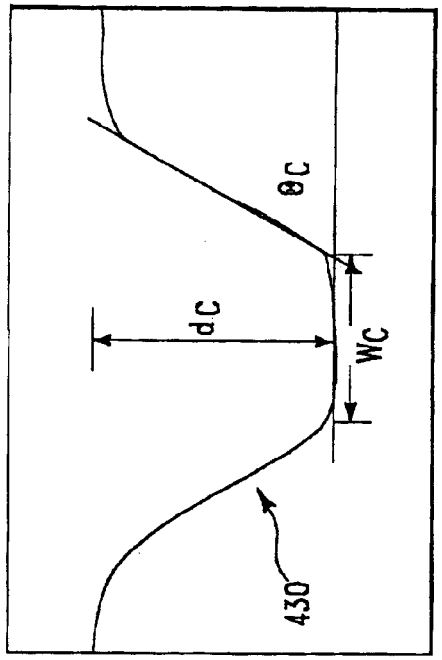

FIGS. 4A–4D show examples of undercut trenches which were prepared using various process chamber pressures, ranging from a low pressure of 30 mTorr (FIG. 4A) to a high pressure of 150 mTorr (FIGS. 4C and 4D). The same process pressure was used during both the etch and the deposition steps. As shown in FIGS. 4A–4D, as the process chamber pressure increased, the etch profile angle θ between the bottom of the trench and the trench sidewalls decreased.

FIG. 4A shows a trench 410 which was formed at a process chamber pressure of 30 mTorr. Trench 410 had a depth $d_A$ of 25 μm, a width $w_A$ of 30 μm, and an etch profile angle $θ_A$ of 82°. Process conditions for the silicon etch ("Etch") and polymer deposition ("Dep") steps used in the preparation of trench 410 are presented in Table Four, below.

TABLE FOUR

Process Conditions Used During Preparation of Trench 410

| | Cycle # | Process Chamber Pressure (mTorr) | Plasma Source Power (W) | Substrate Bias Power (W) | Gas Flow (sccm) | Time (sec) | # of Cycles |
|---|---|---|---|---|---|---|---|
| Dep | 1 | 30 | 1000 | 0 | 100 $C_4F_8$ | 5 | 1 |
| Etch | | | 1000 | 7 | 200 $SF_6$ | 13 | |
| Dep | 2 | 30 | 1000 | 0 | 100 $C_4F_8$ | 5 | 1 |
| Etch | | | 1000 | 7 | 200 $SF_6$ | 12 | |
| Dep | 3 | 30 | 1000 | 0 | 100 $C_4F_8$ | 5 | 1 |
| Etch | | | 1000 | 7 | 200 $SF_6$ | 11 | |
| Dep | 4 | 30 | 1000 | 0 | 100 $C_4F_8$ | 5 | 25 |
| Etch | | | 1000 | 7 | 200 $SF_6$ | 10 | |

FIG. 4B shows a trench 420 which was etched at a process chamber pressure of 120 mTorr. Trench 420 had a depth $d_B$ of 45 μm, a width $w_B$ of 35 μm, and an etch profile angle $\theta_B$ of 74°. Process conditions for the silicon etch and polymer deposition steps used in the preparation of trench 420 are presented in Table Five, below.

TABLE FIVE

Process Conditions Used During Preparation of Trench 420

| | Cycle # | Process Chamber Pressure (mTorr) | Plasma Source Power (W) | Substrate Bias Power (W) | Gas Flow (sccm) | Time (sec) | # of Cycles |
|---|---|---|---|---|---|---|---|
| Dep | 1 | 120 | 1000 | 0 | 100 $C_4F_8$ | 5 | 1 |
| Etch | | | 1000 | 7 | 200 $SF_6$ | 13 | |
| Dep | 2 | 120 | 1000 | 0 | 100 $C_4F_8$ | 5 | 1 |
| Etch | | | 1000 | 7 | 200 $SF_6$ | 12 | |
| Dep | 3 | 120 | 1000 | 0 | 100 $C_4F_8$ | 5 | 1 |
| Etch | | | 1000 | 7 | 200 $SF_6$ | 11 | |
| Dep | 4 | 120 | 1000 | 0 | 100 $C_4F_8$ | 5 | 25 |
| Etch | | | 1000 | 7 | 200 $SF_6$ | 10 | |

FIG. 4C shows a trench 430 which was etched at a process chamber pressure of 150 mTorr. Trench 430 had a depth $d_C$ of 50 μm, a width $w_C$ of 35 μm, and an etch profile angle $\theta_C$ of 60°. Process conditions for the silicon etch and polymer deposition steps used in the preparation of trench 430 are presented in Table Six, below.

TABLE SIX

Process Conditions Used During Preparation of Trench 430

| | Cycle # | Process Chamber Pressure (mTorr) | Plasma Source Power (W) | Substrate Bias Power (W) | Gas Flow (sccm) | Time (sec) | # of Cycles |
|---|---|---|---|---|---|---|---|
| Dep | 1 | 150 | 1000 | 0 | 100 $C_4F_8$ | 5 | 1 |
| Etch | | | 1000 | 7 | 200 $SF_6$ | 13 | |
| Dep | 2 | 150 | 1000 | 0 | 100 $C_4F_8$ | 5 | 1 |
| Etch | | | 1000 | 7 | 200 $SF_6$ | 12 | |
| Dep | 3 | 150 | 1000 | 0 | 100 $C_4F_8$ | 5 | 1 |
| Etch | | | 1000 | 7 | 200 $SF_6$ | 11 | |
| Dep | 4 | 150 | 1000 | 0 | 100 $C_4F_8$ | 5 | 25 |
| Etch | | | 1000 | 7 | 200 $SF_6$ | 10 | |

FIG. 4D shows a trench 440 which was etched at a process chamber pressure of 150 mTorr. Trench 440 had a depth $d_D$ of 55 μm, a width $w_D$ of 35 μm, and an etch profile angle $\theta_D$ of 60°. Process conditions for the silicon etch and polymer deposition steps used in the preparation of trench 440 are presented in Table Seven, below.

TABLE SEVEN

Process Conditions Used During Preparation of Trench 440

| | Cycle # | Process Chamber Pressure (mTorr) | Plasma Source Power (W) | Substrate Bias Power (W) | Gas Flow (sccm) | Time (sec) | # of Cycles |
|---|---|---|---|---|---|---|---|
| Dep | 1 | 150 | 1000 | 0 | 100 $C_4F_8$ | 5 | 35 |
| Etch | | | 1000 | 7 | 200 $SF_6$ | 10 | |

The silicon trench etching process conditions disclosed herein typically provide a silicon etch rate of at least 2 microns per minute; more typically, within the range of about 7 to about 10 microns per minute. The method of trench formation typically provides an etch profile angle θ within the range of about 40° to about 85°. The method is particularly applicable to the etching of trenches having a depth of at least 20 microns and an aspect ratio (width:depth ratio) within the range of about 2:1 to about 1:2, and an etch profile angle ranging from about 60° to about 85°.

The above described exemplary embodiments are not intended to limit the scope of the present invention, as one skilled in the art can, in view of the present disclosure expand such embodiments to correspond with the subject matter of the invention claimed below.

We claim:

1. A method of etching trenches in a substrate which have a trench depth of at least 20 μm and a positive tapered sidewall angle ranging between about 40° and about 85°, wherein the method employs a masking layer overlying said substrate, a series of successive etching and polymer deposition steps, and wherein said etching is carried out at a process pressure ranging from about 30 mTorr to about 150 mTorr, to provide a lateral undercut in said substrate beneath said masking layer, while at the same time etching vertically downward beneath said masking layer, and wherein a coordinated widening of said lateral undercut at the top of said trench with said vertical downward etching provides said positive tapered sidewall angle.

2. A method in accordance with claim 1, wherein said method provides an etched trench having an etch profile angle within the range of about 60° to about 85°.

3. A method in accordance with claim 1, wherein said successive etching and polymer deposition steps are as follows:

a) an etching step which comprises exposing said substrate to a plasma through a pattern in said masking layer;

b) a polymer deposition step which comprises exposing said substrate to a polymer forming plasma; and c) alternatingly repeating step a) and step b) until a predetermined specific trench depth and tapered sidewall angle are achieved.

4. A method in accordance with claim 3, wherein said substrate is selected from the group consisting of silicon, a metal, and an oxide.

5. A method in accordance with claim 4, wherein said etching step is accomplished using a plasma generated from a plasma source gas comprising fluorine species, or chlorine species, or a combination of fluorine species and chlorine species.

6. A method in accordance with claim 4, wherein said polymer deposition step is accomplished using a plasma generated from a plasma source gas selected from the group consisting of $C_4F_8$, $CH_2F_2$, $CHF_3$, and combinations thereof.

7. A method in accordance with claim 4, wherein a bias is applied to said substrate to produce an essentially constant voltage on said substrate during said etching step, and wherein said voltage is in the range between about −2 V to about −100 V.

8. A method in accordance with claim 7, wherein said voltage range is between about −10 V and about −100 V.

9. A method in accordance with claim 8, wherein said voltage range is between about −10 V and about −50 V.

10. A method in accordance with claim 4, wherein said substrate temperature during steps a) and b) ranges from about 40° C. to about 120° C.

11. A method in accordance with claim 4, wherein, subsequent to the last step b), a clean-up step is carried out in which said substrate is exposed to an oxygen plasma.

12. A method of etching a trench in a silicon substrate, wherein the method includes:
   a) an etching step comprising exposing said silicon substrate, through a patterned masking layer, to a plasma generated from a fluorine-containing gas;
   b) a polymer deposition step comprising exposing said silicon substrate to a plasma generated from a gas which is capable of forming a polymer on etched silicon surfaces; and
   c) alternatingly repeating said etching step and said polymer deposition step, wherein said etching step and said polymer deposition step are performed at a process chamber pressure within the range of about 30 mTorr to about 150 mTorr, and wherein a bias power of about 35 W or less is applied to said substrate during said etching step.

13. The method of claim 12, wherein said method provides a trench having a depth of at least 20 microns.

14. The method of claim 12, wherein said method provides a trench having an aspect ratio within the range of about 2:1 to about 1:2.

15. The method of claim 12, wherein said method is performed at a substrate temperature within the range of about 40° C. to about 120° C.

16. The method of claim 12, wherein a ratio of a flow rate of said fluorine-containing gas during said etching step and a flow rate of said polymer-forming gas during said polymer deposition step is within the range of about 6:1 to about 1:1.

17. The method of claim 12, wherein said masking layer comprises a photoresist.

18. The method of claim 12, wherein said masking layer comprises a material selected from the group consisting of silicon oxide, silicon nitride, and silicon oxynitride.

19. The method of claim 12, wherein said method further comprises the following step:
   a-1) a clean-up step, comprising exposing said silicon substrate to an oxygen plasma, and wherein said clean-up step is performed following at least one of said etching steps.

20. The method of claim 12, wherein step a) and step b) are performed in succession for at least 3 cycles.

21. The method of claim 12, wherein said method provides an etched trench having an etch profile angle within the range of about 40° to about 85°.

22. The method of claim 21, wherein said method provides an etched trench having an etch profile angle within the range of about 60° to about 85°.

23. The method of claim 12, wherein said bias power is about 15 W or less.

24. The method of claim 23, wherein said bias power is within the range of about 5 W to about 10 W.

25. The method of claim 12, wherein said silicon substrate is etched at an etch rate of at least 2 microns per minute.

26. The method of claim 25, wherein said silicon substrate is etched at an etch rate of at least 2 microns per minute.

27. The method of claim 12, wherein said substrate is biased using an RF source operating at a frequency within the range of 100 kHz to 13.56 MHz.

28. The method of claim 27, wherein said frequency is within the range of 100 kHz to2 MHz.

29. The method of claim 12, wherein said fluorine-containing gas is selected from the group consisting of $SF_6$, $CF_4$, $NF_3$, and combinations thereof.

30. The method of claim 29, wherein said fluorine-containing gas is $SF_6$.

31. The method of claim 12, wherein said polymer-forming gas is selected from the group consisting of $C_4F_8$, $CH_2F_2$, $CHF_3$, and combinations thereof.

32. The method of claim 31, wherein said polymer-forming gas is $C_4F_8$.

33. The method of claim 12, wherein said polymer-forming gas contains carbon and fluorine in a carbon:fluorine ratio of at least 1:3.

34. The method of claim 33, wherein said carbon:fluorine ratio is at least 1:2.

* * * * *